(12) United States Patent
Montagano et al.

(10) Patent No.: US 6,454,596 B1
(45) Date of Patent: *Sep. 24, 2002

(54) ELECTRICAL CONDUCTOR STRAIN RELIEF FOR A PRINTED CIRCUIT BOARD

(75) Inventors: Antonio Montagano, San Jose, CA (US); Donald C. White, San Ramon, CA (US); Scott B. Beardsley, Union City, CA (US); Bruce J. Hodson, Riverbank, CA (US); Michael J. Schubert, Tracy, CA (US); Mark D. Lee, Ben Lomond, CA (US); Frank M. Vasquez, San Jose, CA (US)

(73) Assignee: FCI Americas Technology, Inc., Reno, NV (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/345,273

(22) Filed: Jun. 30, 1999

(51) Int. Cl.[7] ............................................. H01R 12/24
(52) U.S. Cl. ..................... 439/493; 439/460; 439/732; 439/942
(58) Field of Search ........................... 439/459, 456, 439/457, 493, 449, 942, 458, 460, 732

(56) References Cited

U.S. PATENT DOCUMENTS

| | | | |
|---|---|---|---|
| 3,865,461 A | 2/1975 | Ludwig | 339/103 R |
| 4,139,727 A | 2/1979 | Kuballa | 174/68.5 |
| 4,284,320 A | 8/1981 | Nix et al. | 339/200 |
| 4,758,182 A | 7/1988 | Anbo et al. | 439/592 |
| 4,886,942 A | 12/1989 | Lenz et al. | 174/135 |
| 4,955,814 A | * 9/1990 | Christie et al. | 439/77 |
| 5,186,662 A | 2/1993 | Yuasa et al. | 439/752 |
| 5,344,338 A | 9/1994 | Colleran et al. | 439/465 |
| 5,403,211 A | 4/1995 | Sayer et al. | 439/752 |
| 5,462,451 A | 10/1995 | Yeh | 439/493 |
| 5,481,939 A | * 1/1996 | Bernardini | 74/502.4 |
| 5,516,309 A | 5/1996 | Sayer et al. | 439/752 |
| 5,554,055 A | 9/1996 | Miller | 439/752 |

\* cited by examiner

*Primary Examiner*—Tho D. Ta
*Assistant Examiner*—Truc Nguyen
(74) *Attorney, Agent, or Firm*—Harrington & Smith, LLP

(57) ABSTRACT

An electrical conductor strain relief for connecting electrical conductors to a printed circuit board. The strain relief includes a first member having a first array of first conductor receiving holes and a second member having a second array of second conductor receiving holes. The second member is connectable to the first member at a predetermined fixed location such that the second holes are at least partially aligned with respective ones of the first holes as pairs of holes. The first and second holes of each pair of holes have center axes which are offset relative to each other.

6 Claims, 3 Drawing Sheets

ELECTRICAL CONDUCTOR STRAIN RELIEF FOR A PRINTED CIRCUIT BOARD

BACKGROUND OF THE INVENTION

1. Field of the Invention

The present invention relates to a strain relief for electrical conductors and, more particularly, to a multi-piece strain relief with offset conductor receiving holes.

2. Earlier Developments

U.S. Pat. Nos. 4,886,942 and 5,462,451 disclose unitary strain reliefs for connecting electrical conducts to printed circuit boards. U.S. Pat. No. 3,865,461 discloses a two-piece strain relief each with a hole to receive the cable, but become offset by rotation of the pieces to clamp the cable.

SUMMARY OF THE INVENTION

In accordance with one embodiment of the present invention an electrical conductor strain relief for connecting electrical conductors to a printed circuit board is provided. The strain relief comprises a first member and a second member. The first member has a first array of first conductor receiving holes. The second member has a second array of second conductor receiving holes. The second member is connectable to the first member at a predetermined fixed location such that the second holes are partially aligned with respective ones of the first holes as pairs of holes. The first and second holes of each pair of holes have center axes which are offset relative to each other.

In accordance with one method of the present invention a method of providing a strain relief for conductors attached to a printed circuit board is provided comprising steps of inserting the conductors through separate first holes in a first strain relief member; inserting the conductors through separate second holes in a second strain relief member; attaching the first strain relief member to the printed circuit board and attaching the second strain relief member to the first strain relief member. The first and second holes are respectively aligned with each other at an offset such that each of the conductors pass through a respective pair of the first and second holes with a bend at a junction between the first and second strain relief members.

In accordance with another embodiment of the present invention a printed circuit board and electrical conductor assembly is provided comprising a printed circuit board; electrical conductors soldered to the printed circuit board; and a strain relief connected to the printed circuit board and having the electrical conductors pass therethrough. The strain relief comprises two members with first and second arrays of holes respectively therethrough. A first one of the members is attached to the printed circuit board and a second one of the members is attached to the first member with holes of the first and second arrays being aligned with each other at an offset such that the electrical conductors pass through the holes and are bent at a junction between the two members.

BRIEF DESCRIPTION OF THE DRAWINGS

The foregoing aspects and other features of the present invention are explained in the following description, taken in connection with the accompanying drawings, wherein.

DETAILED DESCRIPTION OF THE PREFERRED EMBODIMENT

Figure 1:
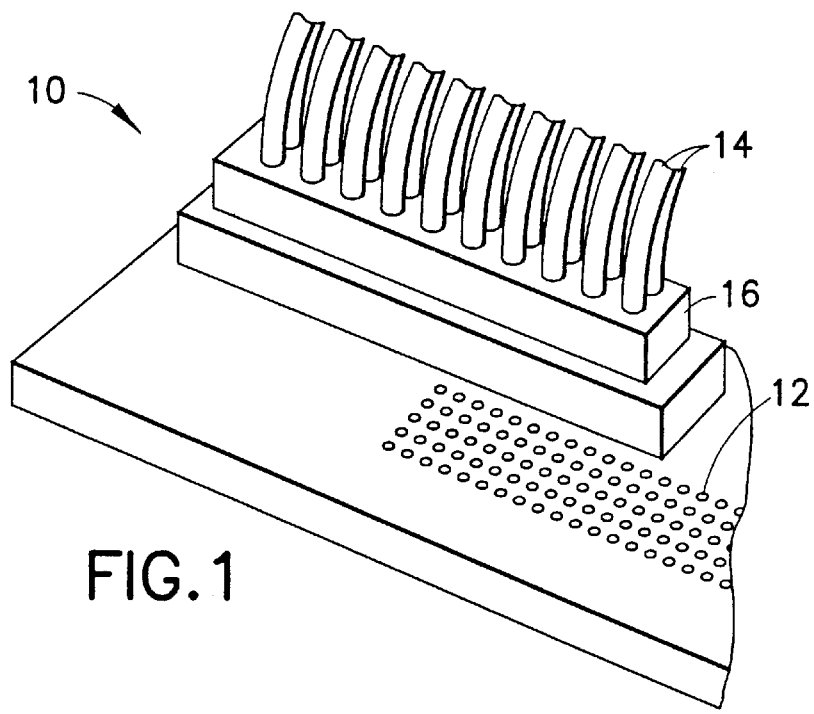
FIG. 1 is a perspective view of an assembly incorporating features of the present invention.

Referring to FIG. 1, there is shown a perspective view of an assembly 10 incorporating features of the present invention. Although the present invention will be described with reference to the single embodiment shown in the drawings, it should be understood that the present invention can be embodied in many alternate forms of embodiments. In addition, any suitable size, shape or type of elements or materials could be used.

Figure 2:
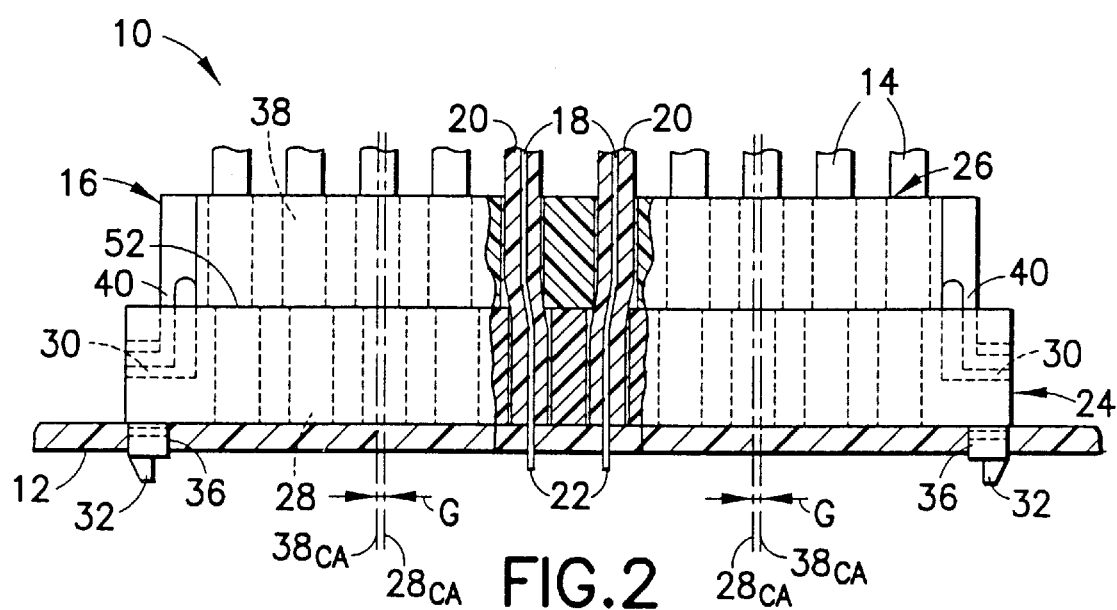
FIG. 2 is a partial cut-away front elevational view of the assembly shown in FIG. 1.

The assembly 10 generally comprises a printed circuit board 12, electrical conductors 14, and a strain relief 16. The printed circuit board 12 can be any type of circuit substrate or, alternatively, any suitable type of electronic component. Referring also to FIG. 2, the electrical conductors 14 are separate wires which each have an electrically conductive core 18 and a dielectric insulative cover 20. However, in alternate embodiments other types of electrical conductors could be provided, such as multi-conductor cables. The conductors 14 pass through the strain relief 16. Exposed ends 22 of the conductive cores 18 pass through holes in the printed circuit board 12 and are soldered to the printed circuit board.

The strain relief 16 is provided to protect the integrity of the electrical connection of the conductors 14 to the printed circuit board 12 by preventing the conductors 14 being pulled away from the board 12 at the soldered connection. In this embodiment the strain relief 16 is comprised of two members; a lower or bottom member 24 and an upper or top member 26. In an alternate embodiment the strain relief may be comprised of more than two members. In a preferred embodiment the members 24, 26 are both one-piece members comprised of molded dielectric material, such as polycarbonate. However, any suitable materials or combination of materials could be used.

Figure 3:
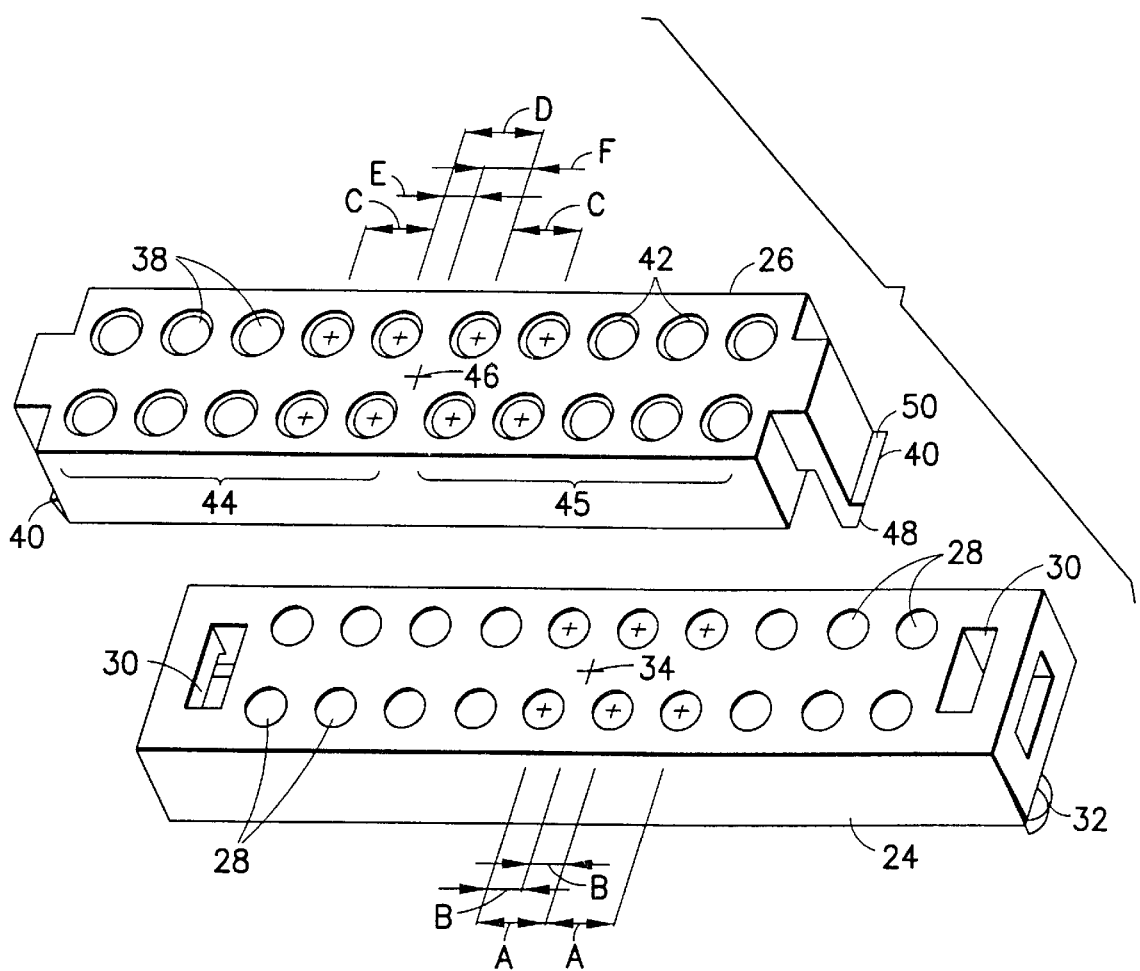
FIG. 3 is an exploded perspective view of the strain relief shown in FIGS. 1 and 2.
Figure 4:
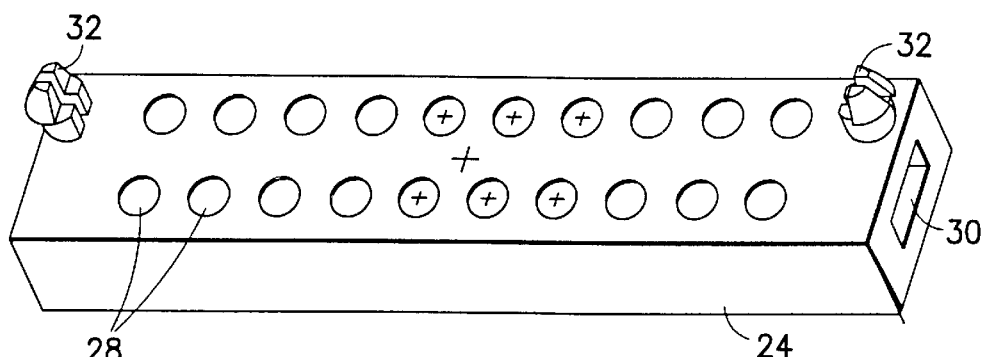
FIG. 4 is a perspective view of the bottom of the lower strain relief member shown in FIG. 3.

Referring also to FIGS. 3 and 4, the bottom member 24 generally comprises a plurality of conductor receiving holes 28, two snap-lock mounting holes 30, and two PCB mounting posts 32. The holes 28 are sized to allow passage of the conductors 14 therethrough with a very small or virtually no spacing therebetween. The holes 28 can be arranged as two rows with an equal spacing A between adjacent holes in each row. The holes 28 nearest the center 34 of the bottom member 24 are spaced a distance B from the center. In this embodiment B is A/2 such that all the holes in each row are equally spaced from each other in a uniform pattern. However, in alternate embodiments any suitable spacing or pattern of the holes 28 could be provided so long as the spacing or pattern cooperates with the spacing and pattern of conductor receiving holes in the upper member 26 as further understood below. The mounting posts 32 extend from the bottom side of the bottom member 24 and are inserted into holes 36 in the printed circuit board 12 to stationarily and fixedly mount the bottom member 24 to the printed circuit board 12. However, any suitable means could be used to stationarily mount the bottom member 24 to the printed circuit board 12.

The top member 26 generally comprises a plurality of conductor receiving holes 38 and two snap-lock latches 40.

The holes 38 are preferably the same size as the holes 28 and are the same in number. The holes 38 have tapered entrances 42 for easier insertion of the conductors 14 into the holes 38. The holes 38 are arranged in two rows, but as two sub-arrays 44, 45; one on each side of the center 46 of the top member 26. The center-to-center spacing C between holes 38 in each sub-array is preferably the same as spacing A; such as about 0.165 inch. However, any suitable dimension could be provided. However, the center-to-center spacing D of the holes 38 closest to the center 46 is preferably larger than the spacing C, such as by a difference of about 0.010–0.015 inch. However, in an alternate embodiment D could be smaller than C. The holes 38 closest to the center 46 are spaced from the center 46 by distances E and F. The distances E and F could be the same, but in a preferred embodiment they are different such as 0.083 inch and 0.0825 inch. However, any suitable distances or dimensions could be provided. The snap-lock latches 40 are located at opposite ends of the top member 26. Each latch 40 extends from the body of the top member 26 in a general cantilever fashion. Each latch 40 is resiliently deflectable with a tapered leading edge 48 and a latching surface 50.

As seen best in FIG. 2, the top member 26 is mounted on top of the bottom member 24. The snap-lock latches 40 are snap-lock latched into the holes 30 to stationarily and fixedly mount the top member 26 to the bottom member 24 at a predetermined position. The holes 38 of the top member 26 are aligned with the holes 28 of the bottom member 24 as pairs of holes which the respective individual conductors 14 pass through. Although the holes 28, 38 are partially aligned, the center axes $28_{ca}$ and $38_{ca}$ of the holes 28, 38 are slightly offset from each other by an offset G. In a preferred embodiment the offset G is about 0.015 inch. However, in alternate embodiments any suitable size of offset could be provided. The centers 34, 46 of the members 24, 26 are aligned when the two members 24, 26 are connected to each other. Because of the different spacings of the sub-arrays 44, 45 from the center 46 and the different uniform spacing of the holes 28 from the center 34, the offset G of the top holes 38 relative to the bottom holes 28 on opposite sides of the centers 34, 46 are in opposite directions. This helps to balance or counteract the forces exerted by the deformation of the conductors 14 that occurs when the two members 24, 26 are connected.

When the two members 24, 26 are connected to each other, because of the offset G and the tight fit of the conductors 14 in the holes 28, 38, the conductors 14 are bent at the junction 52 between the two members 24, 26. The bend in wire 14, along with the size of the holes 28, 38, causes a gripping or clamping action by the strain relief 16 on the conductors 14. Because the strain relief 16 is fixedly and stationarily mounted on the printed circuit board 12, the strain relief 16 prevents any force on the conductors 14 past the top side of the top member 26 being exerted on the connection of the ends 22 to the printed circuit board 12. The two members 24, 26 are preferably attached to each other after the posts 32 are positioned in the holes of the printed circuit board and after the conductors 14 are passed through the holes 28, 29. Preferably the bottom member 24 is attached to the board 12 before the top member 26 is attached to the bottom member 26. However, any suitable assembly procedure could be used.

Figure 5:
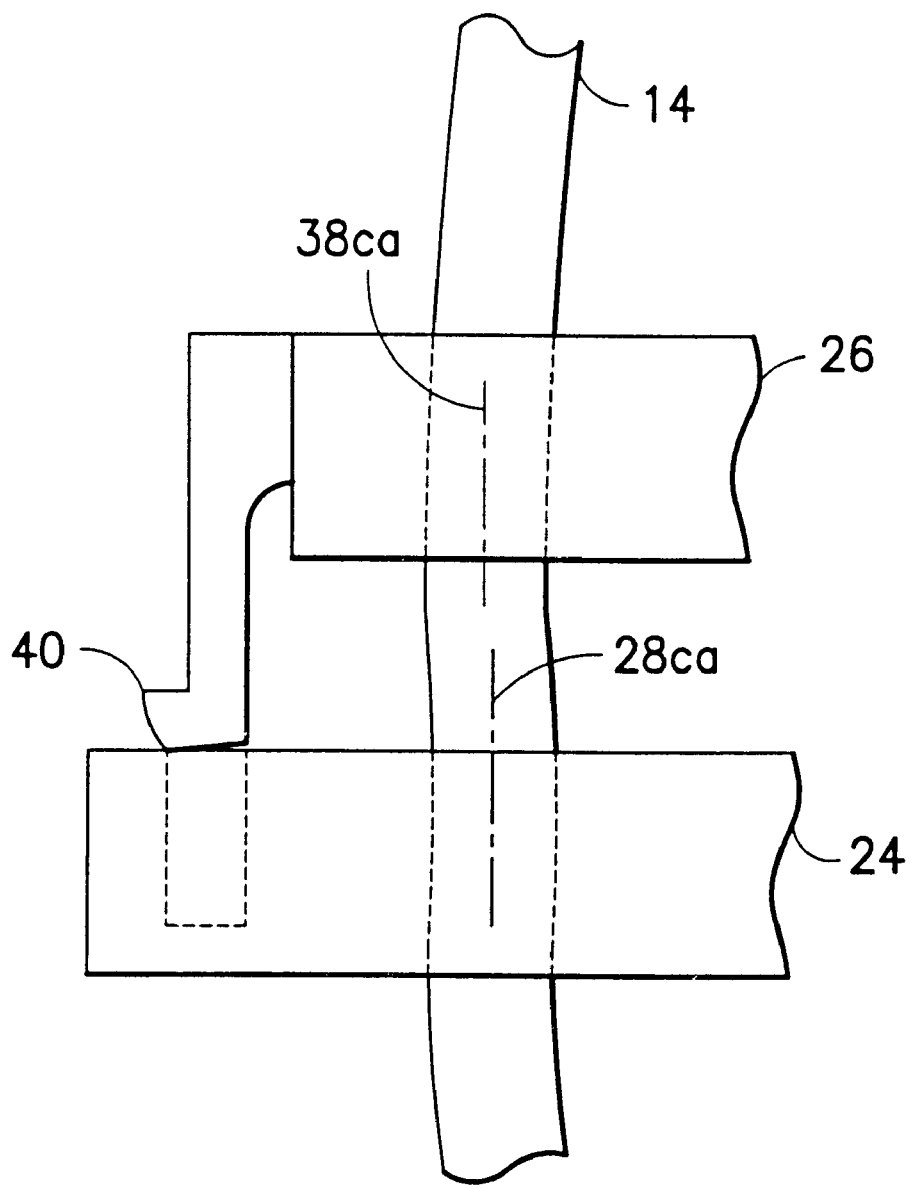
FIG. 5 is an enlarged partial view showing the upper and lower strain relief members being connected to each other.

As seen in FIG. 5, the center axes $28_{ca}$, $38_{ca}$ of the holes 28, 38 are offset even during the initial engagement of latch 40 with hole 30. In other words, the center axes $28_{ca}$, $38_{ca}$ preferably remain offset between the initial engagement position shown in FIG. 5 to the final engagement position shown in FIG. 4.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. An electrical conductor strain relief for connecting electrical conductors to a printed circuit board, the strain relief comprising:

a first member having at least one first conductor receiving hole, the first member being adapted to be connected to the printed circuit board; and a second member having at least one second conductor receiving hole, the second member being connectable to the first member at a predetermined fixed location such that the second hole is at least partially aligned with the first hole as a pair of holes, the first and second holes of the pair of holes having center axes which are offset relative to each other;

wherein the first member comprises a plurality of the first holes arranged in an array of rows, the first holes being equally spaced from adjacent ones of the first holes in a uniform pattern; and wherein the second member comprises a plurality of the second holes arranged in two sub-arrays, the second holes in each sub-array being equally spaced a first distance from adjacent ones of the second holes in its row, and the two sub-arrays being spaced from each other at a different second distance.

2. A strain relief as in claim 1 wherein the first member comprises through-hole mounting posts extending from a bottom side of the first member for positioning in holes of the printed circuit board.

3. A strain relief as in claim 1 wherein the center axes of the first and second holes of each pair of holes are offset relative to each other at about 0.015 inch.

4. A strain relief as in claim 1 wherein the second member is snap-lock mounted to the first member.

5. A strain relief as in claim 4 wherein the second member has cantilevered snap-lock latches which project into snap-lock holes of the first member.

6. An electrical conductor strain relief strain relief for connecting electrical conductors to a printed circuit board, the strain relief comprising:

a first member having at least one first conductor receiving hole, the first member being adapted to be connected to the printed circuit board; and a second member having at least one second conductor receiving hole, the second member being connectable to the first member at a predetermined fixed location such that the second hole is at least partially aligned with the first hole as a pair of holes, the first and second holes of the pair of holes having center axes which are offset relative to each other;

wherein the first member comprises a plurality of the first holes, and the second member comprises a plurality of the second holes, the first and second holes are offset relative to each other in a first direction on a first half of the assembled first and second members and are offset relative to each other in a second opposite direction on a second half of the assembled first and second members.

* * * * *